United States Patent [19]

Gauthier et al.

[11] 4,172,228

[45] Oct. 23, 1979

[54] METHOD FOR ANALYZING RADIATION SENSITIVITY OF INTEGRATED CIRCUITS

[76] Inventors: Robert A. Frosch, Administrator of the National Aeronautics and Space Administration, with respect to an invention of Michael K. Gauthier, Downey; Alan G. Stanley, Sherman Oaks, both of Calif.

[21] Appl. No.: 921,627

[22] Filed: Jun. 30, 1978

[51] Int. Cl.$^2$ ............................................. A61K 27/02
[52] U.S. Cl. ............................... 250/492 A; 250/310; 324/158 T
[58] Field of Search ............... 250/492 A, 492 B, 311, 250/310; 324/158 T

[56] References Cited

U.S. PATENT DOCUMENTS

| | | | |
|---|---|---|---|
| 3,549,999 | 12/1970 | Norton | 250/310 |
| 3,829,961 | 8/1974 | Baverlein et al. | 250/492 A |

*Primary Examiner*—Harold A. Dixon
*Attorney, Agent, or Firm*—Monte F. Mott; John R. Manning; Paul F. McCaul

[57] ABSTRACT

A method for analyzing the radiation sensitivity of an integrated circuit to determine the components, particularly tansistors, of greatest radiation sensitivity, including the application of a narrow radiation beam to portions of the circuit, as by applying the beam of a scanning electron microscope, so the radiation is applied to only one transistor at a time. The circuit is operated under normal bias conditions during the application of radiation in a dosage that is likely to cause malfunction of at least some transistors, while the circuit is monitored for failure of the irradiated transistor. If the irradiated transistor does not fail, then the other transistors are irradiated one at a time. When a radiation sensitive transistor is found, then the radiation beam is further narrowed and, using a fresh integrated circuit, a very narrow beam is applied to different parts of the transistor such as its junctions to locate the points of greatest sensitivity. Knowledge about the particular transistors and the particular portions thereof which are most radiation sensitive, facilitates the redesign of the circuit or fabrication method therefore, to reduce the radiation sensitivity of the circuit.

7 Claims, 6 Drawing Figures

STANDARD NPN

SUPER BETA NPN

LATERAL NPN

VERTICAL NPN

METHOD FOR ANALYZING RADIATION SENSITIVITY OF INTEGRATED CIRCUITS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

The sensitivity of integrated circuits to high radiation levels, is an important factor in many applications. For example, integrated circuits utilized on space vehicles, may be subjected to high radiation levels when passing through belts of ionizing radiation. Similar problems arise in many military missions. A technique utilized in measuring the radiation sensitivity of integrated circuits, has involved the application of successively larger amounts of radiation to the circuit and repeatedly measuring the performance of the circuit, until sufficient degradation or failure occurred. The mode of failure was then analyzed to indicate the region of the circuit which failed, so that modifications could be made in the failed portion of the circuit or in the method of fabricating it, to produce greater radiation insensitivity. The determination of the particular portion of the circuit which failed becomes increasingly more difficult as circuits are utilized which contain increasing numbers of components, and in any case the determination of the exact point of highest radiation sensitivity is difficult. An analyzing method which permitted the more definite location of radiation sensitivity in a circuit, even in a circuit of large size, would facilitate the production of more radiation resistant integrated circuits.

SUMMARY OF THE INVENTION

In accordance with one embodiment of the present invention, a method is provided for analyzing the radiation sensitivity of integrated circuits, which facilitates the "pinpointing" of the most sensitive regions of the circuit. This is accomplished by the use of a narrow radiation beam of sufficient intensity and duration that it is expected to cause failure of at least some of the components of an integrated circuit that has not been fully radiation hardened. The beam is applied to small regions of the circuit such as individual transistors, and the circuit is tested for functioning, to determine whether that particular irradiated transistor can withstand the radiation level. If a transistor functions satisfactorily after irradiation, then other transistors are irradiated in succession and the circuit tested, until a transistor is found which fails. Then, a fresh identical circuit may be tested, by utilizing an even narrower radiation beam, which is applied to different areas of the transistor which corresponds to the one which failed in the first circuit. The very narrow beam is applied to potentially sensitive portions of the transistor, such as the base-emitter junction or base-collector junction, to determine the particular portions of the sensitive transistor or other component, which resulted in the component failure. Knowledge as to the particular portion of a particular transistor which gives rise to radiation sensitivity of the integrated circuit, enables the more effective concentration of efforts to harden the circuit.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
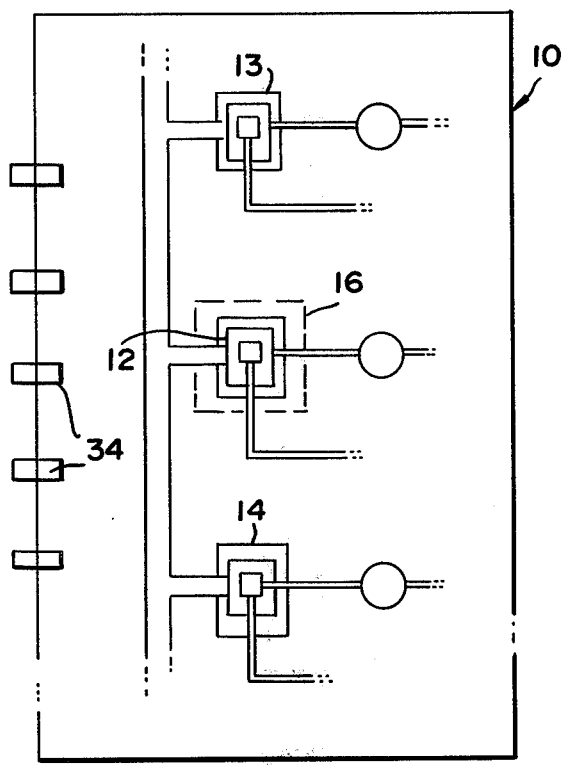
FIG. 1 is a partial view of an integrated circuit, showing the manner in which an initial stage of testing is performed thereon.

FIG. 1 shows an integrated circuit 10 which includes many individual components, including transistors 12, 13, 14 which are sensitive to radiation. Ionizing radiation can produce ions in a region which is supposed to be an insulator, to cause that region to conduct. Although many regions of an integrated circuit can be damaged by high radiation levels, transistors are normally the most radiation sensitive portions, and the radiation can have such effects as reducing the gain of the transistor or creating high leakage currents. The damage to a transistor is typically progressive with progressively increasing amounts of irradiation, and criteria can be established at which the transistor is considered unacceptably damaged, such as where this results in the circuit performance degrading so that there is a high possibility of malfunction of a system utilizing the circuit. An approach that has been utilized in the past, has involved the application of a predetermined dosage of radiation to the entire circuit, and then the testing of the circuit so as to judge the degradation of different portions thereof, so as to determine the circuit portions most radiation sensitive. This enabled redesign of the circuit or the process for manufacture thereof, so as to reduce the radiation sensitivity of that circuit portion. However, even with advanced circuit analysis, it is often difficult to determine the particular component which gives rise to degradation of a circuit function, particularly in the case of large integrated circuits which may contain many thousands of transistors.

In accordance with the present invention, the circuit 10 is analyzed for radiation sensitivity, by the use of a narrow beam 16 of radiation, which is applied to a particular limited region of the circuit, such as a single transistor 12. The beam 16 is applied for a predetermined time, which results in the application of a preset amount of radiation to the component. The preset amount of radiation is of a high level such as $10^6$ rad (Si) which can be expected to damage at least some of the transistors of a radiation unhardened circuit. After the application of the radiation, the circuit is tested to determine whether the operational section of the circuit containing the component 12 is malfunctioning. For example, if the component 12 is a portion of an amplifier of the circuit, test signals may be applied and the circuit output measured, so as to measure the degree of amplification, distortion, power input to the amplification stage, and the like that indicate the functioning of the amplifier operational section of the circuit which contains the tested component. There will normally be some degradation of performance of the circuit resulting from the application of high radiation levels, but if the circuit portion still operates within predetermined limits that are judged to be satisfactory, then the radiation testing method can proceed by irradiating other components such as transistor 14 of the circuit, followed by retesting.

Figure 2:
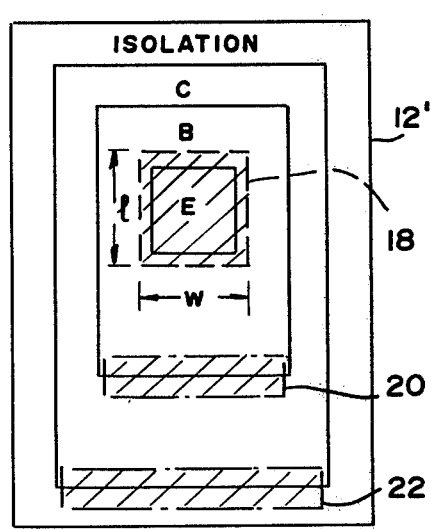
FIG. 2 is a partial plan view of a "standard NPN" transistor component of the circuit of FIG. 1, showing the portions of the transistor which are irradiated in a second step of the invention.

If a component such as transistor 12 is found to have been too severely damaged by the predetermined radiation dose, as by measurements showing that the circuit portion containing that transistor operates unsatisfactorily, then the testing method can proceed in another direction. The testing can now proceed to locate the particular portion of the transistor 12 which gave rise to the failure. This is accomplished by substituting another integrated circuit substantially identical to the circuit 10, so that the test can proceed on a transistor 12' in the new integrated circuit which corresponds to the transistor 12 of the damaged circuit. FIG. 2 shows a standard NPN type transistor which is to be tested for radiation sensitivity.

In testing the transistor 12' of a new circuit, a more narrow beam of controlled dimensions is applied to selected portions of the transistor. The transistor 12' includes a base labelled B, an emitter E, a collector C, and an isolation barrier surrounding the collector, all as shown in FIG. 2. The most radiation sensitive portions of a transistor are usually the junction areas, such as between the base and emitter, base and collector, or collector and surrounding isolation region. The transistor can be tested by applying a beam 18 of predetermined width w and length l, so that the beam covers the base-emitter junction area of the transistor. The beam 18 may be applied for a period to apply a predetermined dosage such as $10^6$ rad (Si). It may be noted that "rad" is an indication of the amount of radiation absorbed per unit volume of an irradiated member, and the term "(Si)" refers to the absorption in the silicon material of the transistor. After the application of the radiation, the integrated circuit is tested to determine the operation of the portion containing the transistor 12'. If the transistor does not fail, then subsequent tests may be made at other regions, as by a beam 20 applied to a portion of the base-collector junction. If no failure occurs there, another beam 22 may be applied to the collector-isolation area junction. A somewhat lower dosage level than $10^6$ rad may be initially applied to each of the junction areas, and if no failure occurs, slightly more radiation may be added to the areas in sequence with testing after each application of radiation. If failure occurs before all areas have been tested to a predetermined level such as $10^6$ rad, then a new circuit identical to 10 may be utilized, in further testing of the other junction areas of the sensitive transistor. In this way by the use of a limited number of integrated circuits all of the same type, the locations of greatest radiation sensitivity can be determined, not only as to the general regions of the circuit, but also as to the specific components such as the transistors thereof, and the particular portions of the sensitive transistors.

In the testing of a transistor 10, the transistor device is preferably first decapped, so that radiation can be applied directly to the functioning area of the transistor, and so that the layout of the transistor can be observed. During the application of a radiation beam, normal bias voltages are applied. This is because the bias conditions have a great effect on the amount of damage done by radiation. For example, the bias voltages can tend to drive secondary ions created by the radiation so as to prevent the secondary ions from leaving an insulator portion, and thereby cause the faster breakdown of the insulator portion. Radiation encountered in the use of an integrated circuit, such as on a space vehicle passing through a radiation belt, can be expected to occur during operation of the circuit under bias conditions, and therefore the use of bias conditions provides a more realistic appraisal of the radiation sensitivity of the circuit.

In the application of radiation to different circuit components, it is preferably to first judge the probable order of sensitivity of the different components, and to irradiate the least sensitive components first, so that most of the circuit testing can be accomplished before a breakdown occurs which requires the replacement of the circuit with another similar one. When irradiating one component of a balanced circuit, such as one transistor of a push-pull amplifier pair, it is preferable to irradiate the two transistors of the balanced pair in sequence. This causes about the same amount of degradation in both of the balanced components, so that the circuit will function more similarly to what would occur under conditions when the entire circuit was irradiated at the same time.

Figure 3:
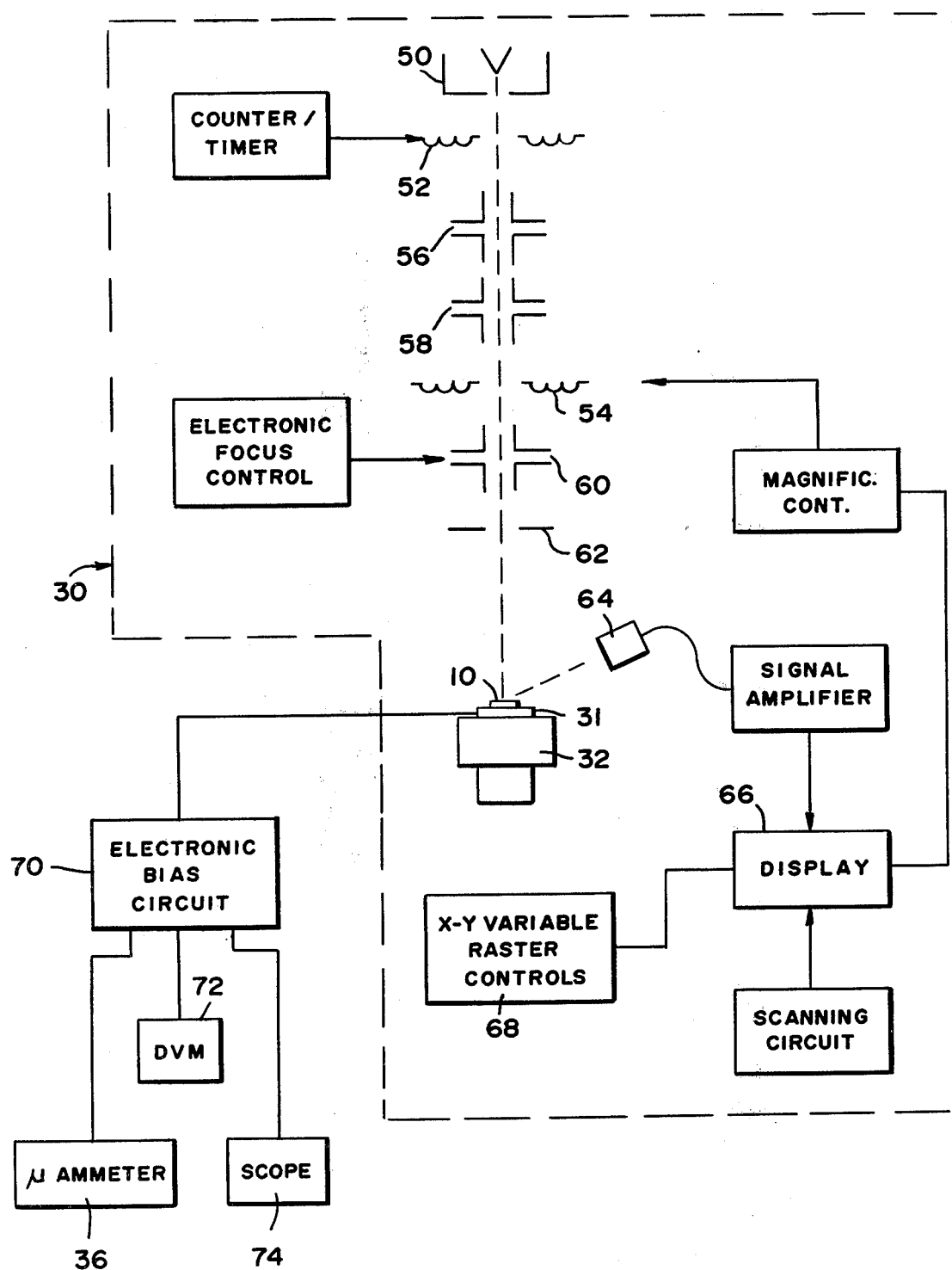
FIG. 3 is a partially diagrammatic, partially block diagram view of a scanning electron microscope test apparatus of the present invention, which can be utilized to perform the method of the invention.

FIG. 3 illustrates a test setup utilized in integrated circuit radiation testing in accordance with the invention. A Cambridge Model MKII-A scanning electron microscope (SEM) 30 was utilized, which includes a rastering feature whereby the electron beam scan can be limited both horizontally and vertically (the dimensions w and l in FIG. 2) so that only a selected component or portion of one component can be irradiated. This SEM also provides an electron beam spot mode that permits a dot of irradiation to be manually scanned over the area of interest to pinpoint the exact area of maximum radiation effects. The integrated circuit 10 was placed on a test board 31 on the stage 32 of the SEM and preliminary set up and raster adjustments were made at a low beam level of 2 keV to minimize the radiation effects prior to a timed exposure. Then the electron energy was switched to 30 keV, which was chosen to allow penetration through the metal and insulation layers of the integrated circuit (the cap was already removed). Normally, a voltage of at least 10,000 volts must be applied to an electron beam to cause penetration of the thickness of perhaps several microns of an exposed integrated circuit to cause damage. In order to calibrate the absorbed electron beam current at a fixed final aperture setting, the electron beam was first distributed over the entire area of a separate calibration chip and the total current absorbed by the device was measured by shorting all the terminals 34 (FIG. 1) of the calibration integrated circuit to ground through a microammeter 36 (FIG. 3). During the irradiation of a single transistor or other small area of the circuit to be tested, the same beam current was confined to the small area by narrowing the beam through use of a raster control on the SEM. The absorbed current was converted to a flux rate in rad (Si) per second with a suitable correction for the 30 keV beam. The beam current was typically 12 pA for radiation insensitive (hardened) devices and 6 pA for unhardened devices. The typical exposure time was less than one minute, such as one half minute, for a total dose of $10^6$ rad (Si).

Figure 4:
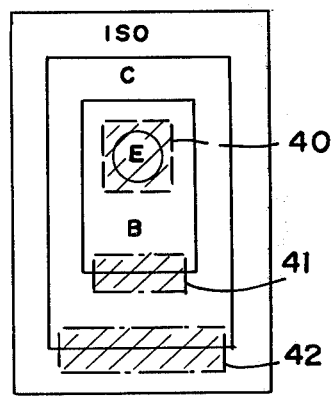
FIG. 4 is a partial plan view of a "super beta NPN" type transistor, showing the localized areas thereof which are irradiated in a step of the invention.
Figure 5:
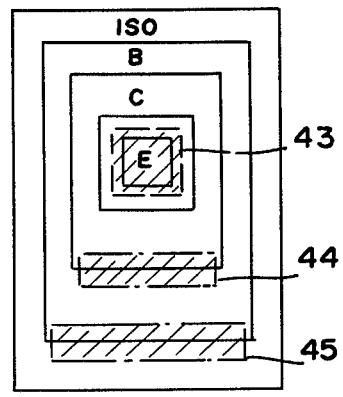
FIG. 5 is a partial plan view of the "lateral NPN" transistor, showing the localized areas thereof which are irradiated in a step of the invention.
Figure 6:
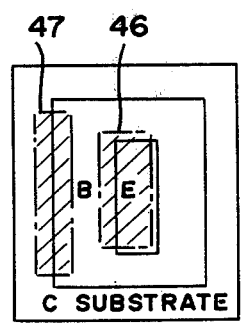
FIG. 6 is a partial plan view of a "vertical NPN" transistor, showing the localized areas thereof which are irradiated in a step of the invention.

FIGS. 4–6 illustrate important areas of three types of transistors, and show the areas 40–46 thereof which have been irradiated in tests to determine which junctions of the transistors are the most radiation sensitive. With the emitters of the transistors occupying a central confined area, irradiation of the junction of the emitter with an adjacent base or collector is typically accomplished by irradiating the entire emitter and a small area around it which includes the junction. For the other junction areas such as area 41 between the base and collector of a transistor, only a portion of the junction normally needs to be irradiated, to provide an indication of the junction sensitivity to radiation.

The SEM 30 includes a normal electron gun 50, a blanking coil 52 and a deflection coil 54, a pair of condensor lenses 56, 58, and a final lens 60 followed by a final aperture 62. This permits the application of a very narrow beam. A detector 64 detects the location of the beam on the integrated circuit 10, and the location is displayed on a screen display 66. A raster control 68 moves the position of the beam and controls its horizontal and vertical dimensions. In addition to the SEM, an electronic bias circuit 70 is provided to operate the circuit 10 under normal bias conditions, while a digital voltmeter 72 and oscilloscope 74 permit monitoring of the operation of different portions of the circuit.

The utilization of narrow beams to irradiate selected components, particularly transistors, of an integrated circuit, and then selected junction areas of the transistor, has been found to enable rapid identification of the areas of highest radiation sensitivity of circuits. Excellent correlation has been established between the results of the narrow beam analysis of the present invention, and the results obtained when irradiating complete devices and making detailed analysis to determine the components giving rise to the degradation in the circuit operation. Once the areas of higher sensitivity are determined, particular attention can be devoted to the hardening of these areas against radiation sensitivity. For example, the oxide layer around a transistor can be passivated or applied at a different temperature, or applied under cleaner conditions, to reduce the radiation sensitivity.

It may be noted that narrow electron beams have previously been utilized on integrated circuits, but normally only low radiation levels have been applied (such as when low voltages under 10,000 e.v. were applied even with considerable beam current) which would avoid damage to the circuit, rather than high levels to purposely cause such damage. Such low radiation has been applied for a variety of purposes, such as to enable detection of secondary electron emissions, or to apply a current through the beam that causes only a selected portion of the circuit to operate. The application of radiation levels of a level high enough so that they are likely to cause damage to certain components of a circuit, such as within an order of magnitude of the radiation level per unit area which would be expected to cause malfunction of a circuit when applied to the entire circuit, can here permit the analysis of a circuit for radiation sensitivity. A typical circuit radiation resistance specification is $10^6$ rad; that is, that the circuit be able to function (even though at a somewhat degraded level) when subjected to radiation of $10^8$ evgs of absorbed radiation per gram of irradiated material. In the present method, the narrow electron beam is applied for a sufficient time to each transistor, to apply a level of radiation such as $10^6$ rad. It may be noted that CMOS transistors utilized in memory arrays are much more radiation sensitive, being damaged by doses such as $10^3$ to $10^4$ rad, so that lower doses can be utilized for such circuits.

Although particular embodiments of the invention have been described and illustrated herein, it is recognized that modifications and variations may readily occur to those skilled in the art, and consequently, it is intended that the claims be interpreted to cover such modifications and equivalents.

The embodiments of the invention in which an exclusive property or privilege is claimed are defined as follows:

1. A method for analyzing an integrated circuit that includes a multiplicity of components, for high level radiation sensitivity, comprising:
   applying a narrow beam of ionizing radiation sequentially to each of different limited portions of said circuit, wherein each limited portion includes a minority of the entire components of the circuit;
   operating said integrated circuit while testing for failure of operation of said integrated circuit, after the application of a narrow beam to each limited circuit portion;
   upon detecting of failure of said circuit, utilizing a second integrated circuit of the same type as the first named integrated circuit, by applying a narrower beam of ionizing radiation successively to different local regions of the limited circuit portion of the second circuit which corresponds to the circuit portion of the first named circuit which was irradiated just prior to the circuit failure, wherein each of said local regions comprises a minority of the circuit portion; and
   operating said second integrated circuit while testing for failure of operation of said circuit, after each of said steps of applying a narrower beam.

2. The method described in claim 1, wherein:
   said circuit includes a plurality of transistors;
   said step of applying a narrow beam includes applying a beam that covers the area occupied by substantially an entire transistor of the integrated circuit, wherein the transistor has a base, collector, and emitter; and
   said step of applying a narrower beam comprises applying a beam that covers at least a portion of the junction between the base and emitter but not the junction between the base and collector of the transistor.

3. The method described in claim 1 wherein:
   said circuit includes a plurality of transistors; and
   said step of applying a narrow beam includes applying a beam that covers the area occupied by substantially an entire transistor of the integrated circuit, wherein the transistor has a base, collector, and emitters; and
   said step of applying a narrower beam comprises applying a beam that covers at least a portion of the junction between the base and collector but not the junction between the base and emitter.

4. A method for analyzing an integrated circuit that includes a multiplicity of components, for high level radiation sensitivity, comprising:

applying a narrow beam of ionizing radiation sequentially to each of different limited portions of said circuit, wherein each limited portion includes a minority of the entire components of the circuits; and operating said integrated circuit while testing for failure of operation of said integrated circuit, after the application of a narrow beam to each limited circuit portion;

said step of applying a narrow beam includes applying ionizing radiation in a dosage which is more than one-tenth the level which will damage the integrated circuit when the same dosage is applied to all of the integrated circuit.

5. A method for analyzing an integrated circuit that includes a multiplicity of components, for high level radiation sensitivity, comprising:

applying a narrow beam of ionizing radiation sequentially to each of different limited portions of said circuit, wherein each limited portion includes a minority of the entire components of the circuit; and operating said integrated circuit while testing for failure of operation of said integrated circuit, after the application of a narrow beam to each limited circuit portion; and wherein said integrated circuit includes a balanced network with matching components; and said narrow beam is applied sequentially to said matching components, whereby to obtain a circuit degradation corresponding more closely to the result of irradiating the entire circuit.

6. A method for analyzing an integrated circuit that includes a multiplicity of components, for high level radiation sensitivity, comprising:

applying a narrow beam of ionizing radiation sequentially to each of different limited portions of said circuit, wherein each limited portion includes a minority of the entire components of the circuit; and operating said integrated circuit while testing for failure of operation of said integrated circuit, after the application of a narrow beam to each limited circuit portion;

said step of applying a narrow beam comprising applying said beam individually to different components of the same operational section of the integrated circuit, including applying said beam to the different components in the order of their expected radiation sensitivity beginning with the least radiation sensitive component, whereby when a component fails it will be operating in a circuit section wherein the other components thereof have been degraded by radiation, to simulate operation under conditions wherein all portions of the integrated circuit are simultaneously subjected to radiation.

7. A method for analyzing an integrated circuit which includes a multiplicity of transistors, for high level radiation sensitivity, comprising:

irradiating each of a plurality of individual active areas of said integrated circuit wherein each area includes a single transistor, with ionizing radiation of an intensity of at least $10^5$ rad;

operating at least the portion of said circuit which contains the transistor being irradiated, under approximately normal operating bias conditions;

testing at least said circuit portion for failure of operation; and after detection of the failure of a circuit portion of an integrated circuit, substituting a new integrated circuit of substantially identical construction for the first named circuit, and irradiating at least a portion of one junction of the transistor of the new circuit which corresponds to the failed transistor of the first named circuit.

* * * * *